(12) United States Patent
Lin et al.

(10) Patent No.: US 9,140,745 B1
(45) Date of Patent: Sep. 22, 2015

(54) SYSTEM AND METHOD FOR CLOUD TESTING AND REMOTE MONITORING OF INTEGRATED CIRCUIT DEVICES

(71) Applicant: Unigen Corporation, Fremont, CA (US)

(72) Inventors: David S. Lin, Taipei (TW); Yu-Chieh Tseng, Taipei (TW); Pei-Lung Yeh, Taipei (TW); Yi-Chieh Lin, Taipei (TW); Che-Chen Chuang, Taipei (TW)

(73) Assignee: Unigen Corporation, Fremont, CA (US)

( * ) Notice: Subject to any disclaimer, the term of this patent is extended or adjusted under 35 U.S.C. 154(b) by 58 days.

(21) Appl. No.: 14/198,474

(22) Filed: Mar. 5, 2014

(51) Int. Cl.
*G01R 31/20* (2006.01)
*G01R 31/28* (2006.01)
*G06F 11/263* (2006.01)
*G06F 11/22* (2006.01)
*G06F 11/273* (2006.01)

(52) U.S. Cl.
CPC ........ *G01R 31/2834* (2013.01); *G01R 31/2851* (2013.01); *G06F 11/22* (2013.01); *G06F 11/2294* (2013.01); *G06F 11/263* (2013.01); *G06F 11/2635* (2013.01); *G06F 11/273* (2013.01)

(58) Field of Classification Search
CPC ............ G01R 31/2834; G01R 31/2851; G06F 11/2294; G06F 11/22; G06F 11/263; G06F 11/2635; G06F 11/273; G06F 11/3672; G06F 11/3688; G06F 11/3692
USPC .............. 324/71, 378, 403, 415, 425, 754.01, 324/754.03, 754.05; 702/108, 118, 121; 714/27, 38.14
See application file for complete search history.

(56) References Cited

U.S. PATENT DOCUMENTS 8,874,953 B2* 10/2014 Tseng et al. ................... 714/4.1
2012/0166605 A1* 6/2012 Chou ............................ 709/223
2014/0156832 A1* 6/2014 Stanko et al. ................. 709/224

* cited by examiner

*Primary Examiner* — Jermele M Hollington
*Assistant Examiner* — Raul Rios Russo
(74) *Attorney, Agent, or Firm* — Osha Liang LLP (57) ABSTRACT

In a system and method for cloud testing and remote monitoring of IC devices on a computerized test platform, the computerized test platform sends to a cloud server unit, which stores test programs corresponding respectively to different test items, a test request, which includes respective device codes of the IC devices and one (s) of the test items, via a communication network. The cloud server unit sends to the computerized test platform a test response, which includes one (s) of the test programs corresponding to the one (s) of the test items. The computerized test platform products test data corresponding to the device codes of the IC devices in response to execution of the one (s) of the test programs.

17 Claims, 5 Drawing Sheets

SYSTEM AND METHOD FOR CLOUD TESTING AND REMOTE MONITORING OF INTEGRATED CIRCUIT DEVICES

BACKGROUND OF THE INVENTION

1. Field of the Invention

The invention relates to testing an integrated circuit device, and more particularly to a system and method for cloud testing and remote monitoring of integrated circuit devices on the same testing apparatus.

2. Description of the Related Art

Integrated circuit (IC) devices are typically subject to rigorous testing before they are sold or put to their intended use. In particular, each IC device is tested to determine whether or not certain specifications for that type of device, as determined and set by the manufacturer, are met.

For example, a memory device (or a memory module) is one of the key components for stability and reliability in operation of an operating system of a personal computer. Therefore, before the memory device is sold, it is required for the manufacturer thereof to have professional testers carry out compatibility and reliability tests of the memory device in a computer system. Currently, different test software programs have been developed for common memory tests, wherein each test software program is executed via manual operation of a dedicated test interface thereof to create a test result that is to be recorded in writing. Through such manual testing operation, unintentional human errors may occur. In this case, greater test costs and longer test time are needed.

In order to overcome the above disadvantages, an automated test equipment, e.g., a test system provided by KingTiger Technology Inc., has been proposed to automatically carry out compatibility and reliability tests of memory devices and modules. However, such automated test equipment may be relatively complicated, and have a limited throughput and a relatively costly sale price of about one million U.S. dollars.

SUMMARY OF THE INVENTION

Therefore, an object of the present invention is to provide a system and method for cloud testing and remote monitoring of integrated circuit (IC) devices that can overcome the aforesaid drawbacks of the prior art.

According to one aspect of the present invention, there is provided a system for cloud testing and remote monitoring of a plurality of IC devices. Each of the IC devices has a unique device code. The system of the present invention comprises:

a testing apparatus including a computerized test platform provided with a multi-interface connector unit, which is used to connect with the IC devices, and a network interface unit; and a cloud server unit connected to a communication network, the cloud server unit including a database for storing a plurality of test programs that correspond respectively to a plurality of different test items.

When the testing apparatus establishes, using the network interface unit, a communication link with the cloud server unit over the communication network, the testing apparatus is operable to send a test request to the cloud server unit via the communication link, the test request including the device codes of the IC devices that are connected to the computerized test platform, the test platform code of the computerized test platform, and at least one of the test items that is associated with the IC devices, in response to receipt of the test request from the testing apparatus, the cloud server unit is operable to send a test response to the testing apparatus via the communication network, the test response including at least one of the test programs that is stored in the database and that corresponds to said at least one of the test items, and upon receipt of the test response from the cloud server unit, the computerized test platform is operable to produce test data that corresponds to the device codes of the IC devices in response to execution of the at least one of the test programs.

According to another aspect of the present invention, there is provided a method for cloud testing and remote monitoring of a plurality of IC devices using a system that includes a testing apparatus and a cloud server unit connected to a communication network. The testing apparatus includes a computerized test platform connected to the IC devices. Each of the IC devices has a unique device code. The cloud server unit stores a plurality of test programs that correspond respectively to a plurality of different test items. The method of the present invention comprises the steps of:

a) upon establishing a communication link with the cloud server unit, the computerized test platform of the testing apparatus sending a test request to the cloud server unit via the communication link, the test request including the device codes of the IC devices, the test platform code of the computerized test platform, and at least one of the test items that is associated with the IC devices;

b) in response to receipt of the test request from the computerized test platform, the cloud server unit sending a test response to the computerized test platform via the communication link, the test response including at least one of the test programs that corresponds to the at least one of the test items; and c) upon receipt of the test response from the cloud server unit, the computerized test platform executing the at least one of the test programs to produce test data that corresponds to the device codes of the ID devices.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
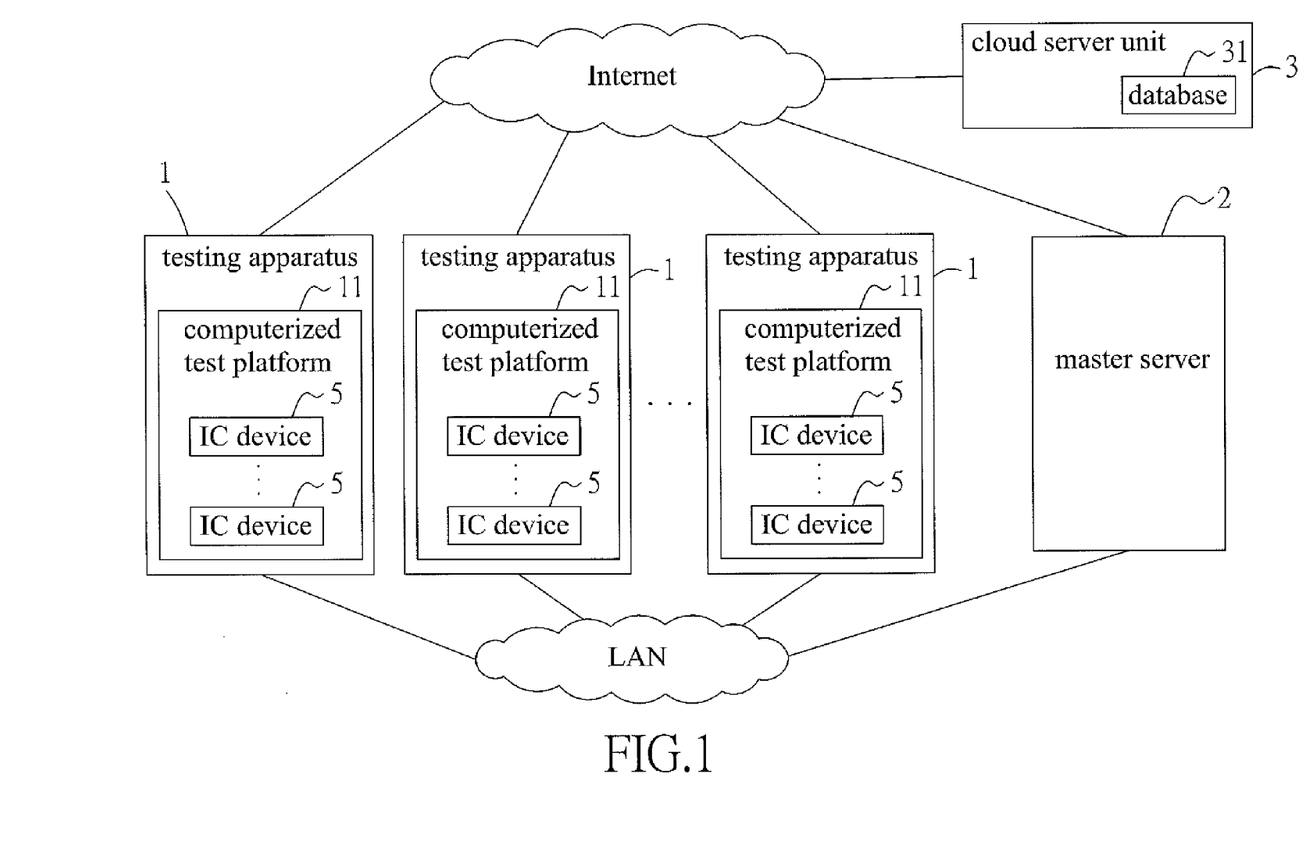
FIG. 1 is a schematic block diagram illustrating the preferred embodiment of a system for cloud testing and remote monitoring of a plurality of integrated circuit (IC) devices according to the present invention.
Figure 2:
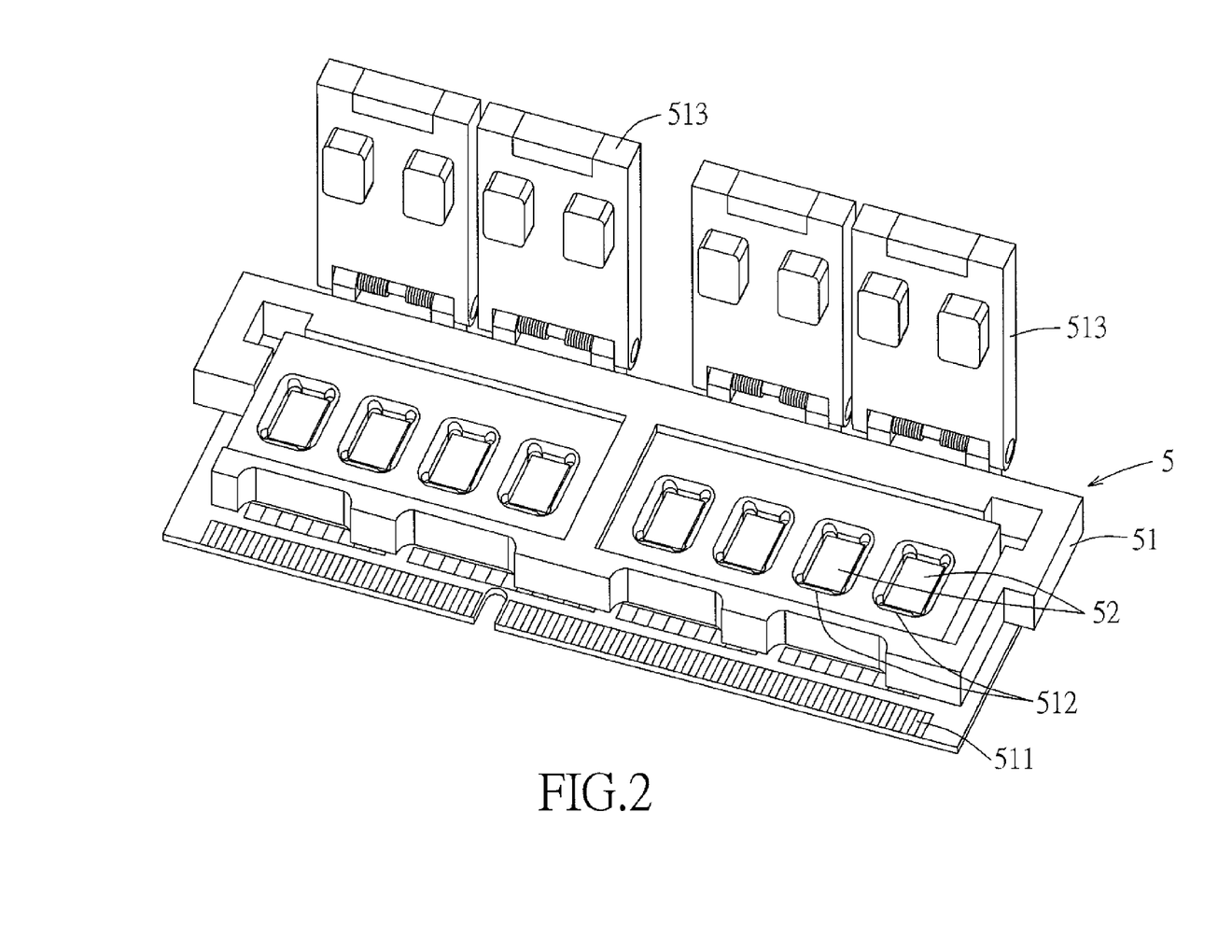
FIG. 2 is a perspective view showing an exemplary IC device.

Referring to FIG. 1, the preferred embodiment of a system for cloud testing and remote monitoring of a plurality of integrated circuit (IC) devices 5 according to the present invention is shown to include a plurality of testing apparatuses 1, a master server 2 and a cloud server unit 3. Each IC device 5 has a unique device code. In this embodiment, the IC device 5 may be, but is not limited to, a memory module, such as a memory card, or a solid state disk (SSD). When the IC device 5 is a memory module or an SSD, a product serial number serves as the unique device code. In addition, referring to FIG. 2, the IC device 5 may be an IC assembly, which includes a test fixture 51, and a plurality of memory ICs 52, such as double-data-rate two synchronous dynamic random access memories (DDR2 SDRAMs), DDR3 SDRAMs or DDR4 SDRAMs, that are disposed detachably in the test fixture 51. The test fixture 51 has the unique device code, and includes a base body that has a connection interface 511 and that is formed with a plurality of IC-mounting seats 512 for receiving respectively the memory ICs 52 therein, and a plurality of covers 513 each operable to cover corresponding ones of the IC mounting seats 512 to secure the memory ICs 52 in the corresponding ones of the IC mounting seats 512 in a manner that the memory ICs 52 are connected electrically to the connection interface 511. It is noted that, for example, the connection interface 511 of the test fixture 51 may be designed to be identical to a connection interface of the memory module.

Figure 3:
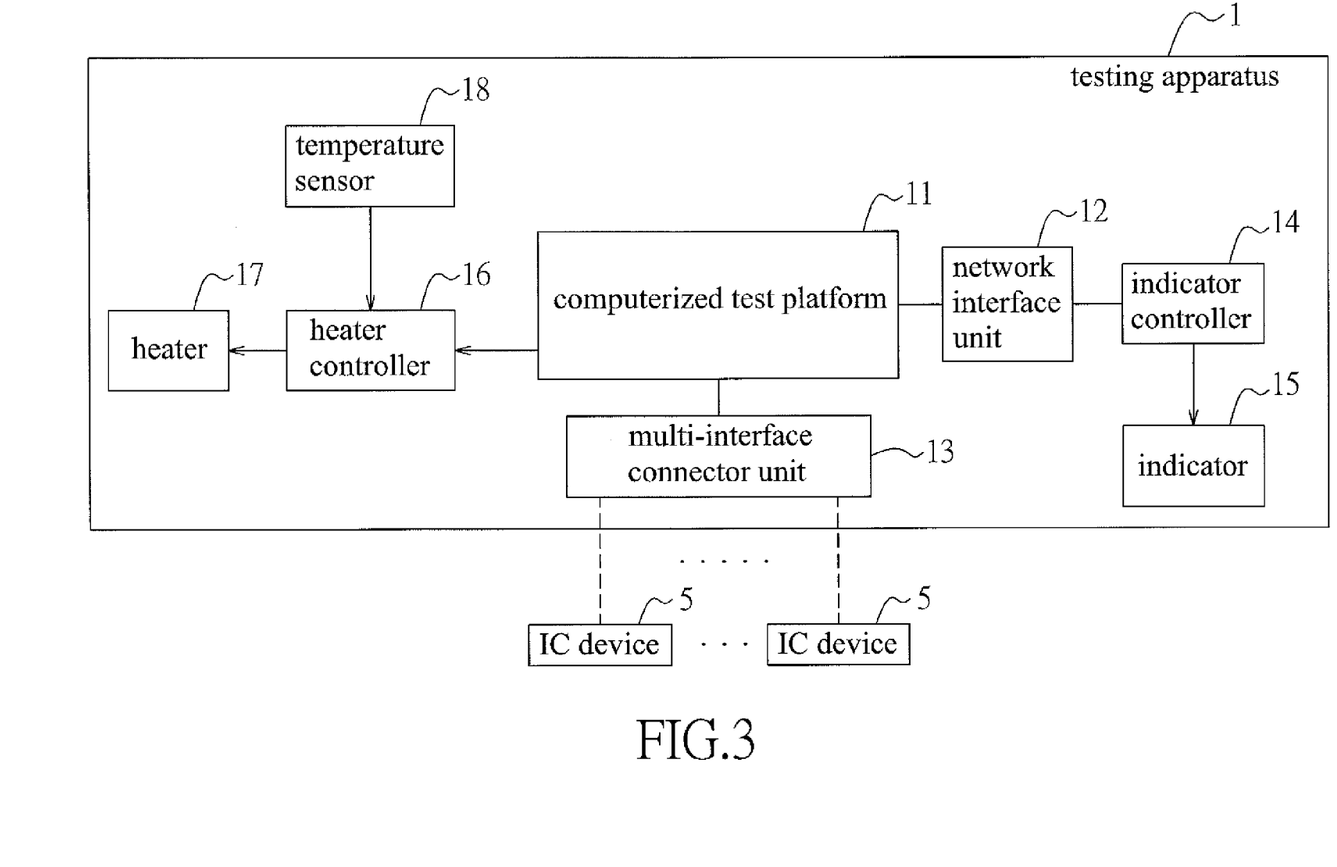
FIG. 3 is a schematic block diagram illustrating one testing apparatus of the preferred embodiment of the system.
Figure 4:
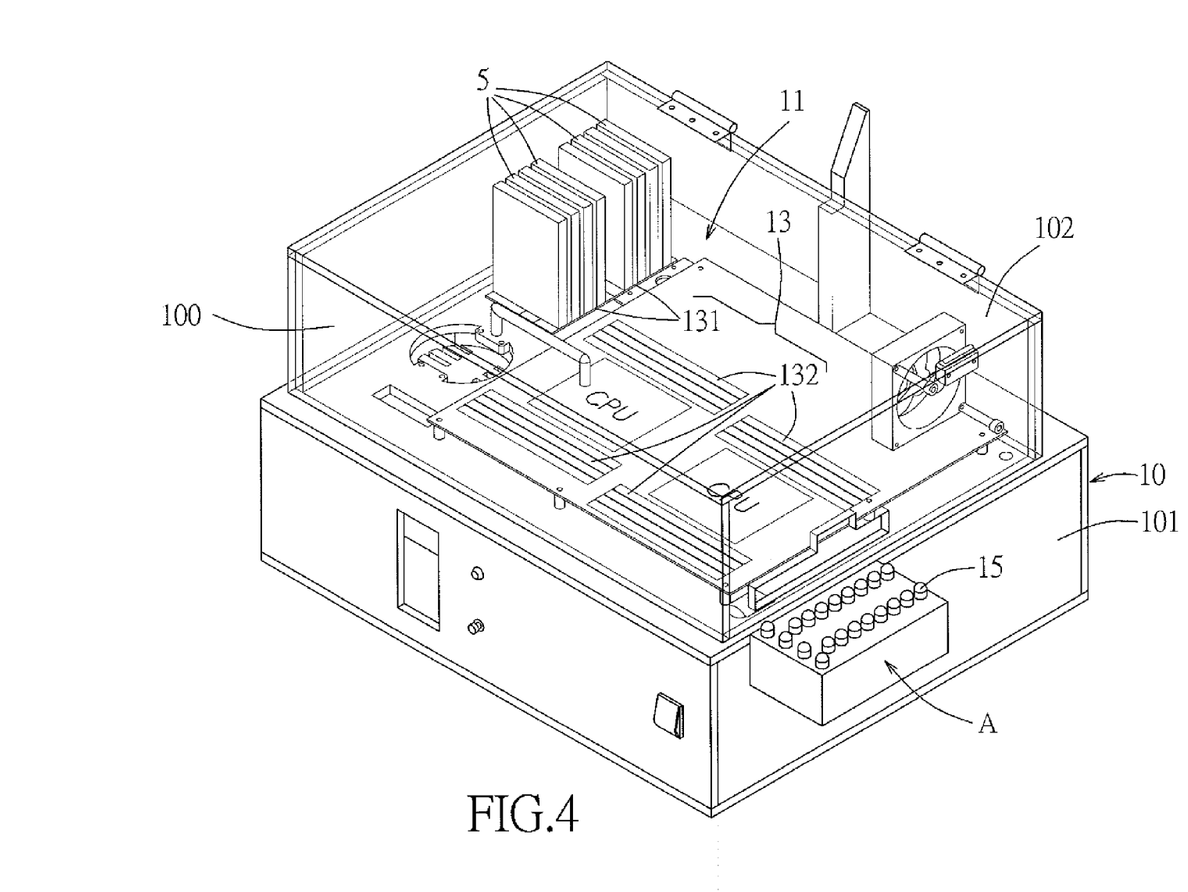
FIG. 4 is a perspective view showing the testing apparatus of the preferred embodiment of the system.

Referring further to FIGS. 3 and 4, each testing apparatus 1 is shown to include a housing 10, a computerized test platform 11, a network interface unit 12, a multi-interface connector unit 13 provided on the computerized test platform 11, an indicator controller 14, an indicator 15, a heater controller 16, a heater 17 and a temperature sensor 18.

The housing 10 consists of a hollow base 101, and a transparent cover body 102 connected pivotally to the base 101 and cooperating with the base 101 to define a test chamber 100 for receiving the computerized test platform 11 and the IC devices 5 therein.

The computerized test platform 11 may include a motherboard, two central processing units (CPUs), bridge chips, etc. (not shown), wherein a basic input/output system (BIOS) resident on the motherboard contains a unique test platform code for identifying the computerized test platform 11 or the testing apparatus 1.

The network interface unit 12 may be, for example, a network interface card, and is connected wiredly to the computerized test platform 11. As such, the computerized test platform 11 can establish a connection with a communication network, such as the Internet, or a local area network (LAN) using the network interface unit 12.

The multi-interface connector unit 13 is provided on the computerized test platform 11 and is connected electrically to the motherboard. In this embodiment, the multi-interface connector unit 13 includes a plurality of first connectors 131 each with a first interface, and a plurality of second connectors 132 each with a second interface different from the first interface. For example, the multi-interface connector unit 13 has, but is not limited to, eight first connectors 131 and sixteen second connectors 132. For instance, the first interface may conform with a connection interface of an SSD. Therefore, the eight first connectors 131 are used to connect respectively with eight SSDs serving as the IC devices 5 during an SSD test. The second interface may conform with the connection interface of a memory module or the connection interface 511 of the test fixture 51 of the IC assembly shown in FIG. 2. Therefore, the sixteen second connectors 132 are used to connect respectively with sixteen memory modules serving as the IC devices 5 during a memory module test. Alternatively, since the test fixture 51 is generally thicker than the memory module, for example, at most eight IC assemblies serving as the IC devices 5 may be connected respectively to eight of the sixteen second connectors 132 during a memory IC test.

The indicator controller 14 is connected electrically to the network interface unit 12 and the indicator 15 for controlling the indicator 15. In this embodiment, the network interface unit 12, the indicator controller 14 and the indicator 15 may be integrated into a single module (A) separate from the computerized test platform 11 (see FIG. 4). In addition, for example, the indicator 15 may include, but is not limited to, sixteen light emitting diodes (LEDs) for mainly indicating test results of the IC devices 5, and additional four LEDs for operation status indication. The heater 17 is disposed in the base 101 (not seen in FIG. 4). The temperature sensor 18 is disposed in the test chamber 100 (omitted from FIG. 4) for sensing a temperature in the test chamber 100. The heater controller 16 is connected electrically to the heater 17 and the temperature sensor 18. The heater controller 16 is operable to control operation of the heater 17 based on the temperature in the test chamber 100 as sensed by the temperature sensor 18 to maintain the temperature in the test chamber 100 at a desired temperature level. The heater controller 16 is further connected electrically to the computerized test platform 11.

The master server 2 is connected to the Internet and the LAN. The master server 2 is capable of communicating with the computerized test platform 11 over the LAN. In practice, for example, the testing apparatuses 1 and the master server 2 may be located inside the same testing facility.

The cloud server unit 3 is connected to the Internet so as to communicate with the master server 2 and the testing apparatuses 1 over the Internet. The cloud server unit 3 includes a database 31 for storing a test operating system (OS) corresponding to the computerized test platform 11 of each testing apparatus 1, and a plurality of test programs that correspond respectively to a plurality of different test items associated with different types of IC devices 5, such as SSDs, memory modules and IC assemblies.

Figure 5:
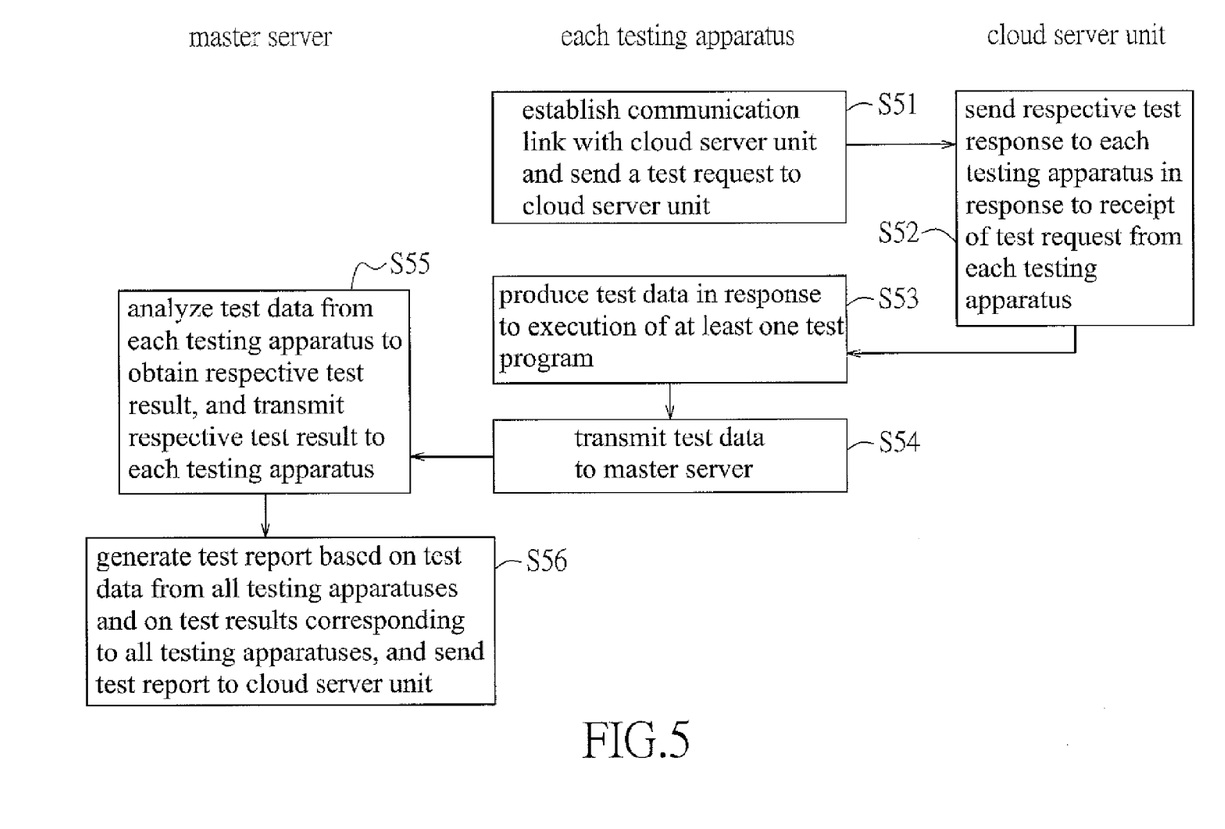
FIG. 5 is a flow chart illustrating how the preferred embodiment of a method for cloud testing and remote monitoring of the IC devices according to the present invention is implemented using the system of FIG. 1.

Operation of the system will now be illustrated in conjunction with FIG. 5, which is a flow chart of a method of a preferred embodiment for cloud testing and remote monitoring of IC devices 5 according to the present invention.

In step S51, initially, after entering a Windows® preinstallation environment, the computerized test platform 11 of each testing apparatus 1 establishes a communication link with the cloud server unit 3 over the Internet and sends a test request to the cloud server unit 3 via the established communication link. The test request sent from each testing apparatus 1 includes the device codes of the IC devices 5 connected thereto, the test platform code of the computerized test platform 11 thereof, and at least one of the test items associated with the IC devices 5 connected thereto. It is noted that the IC devices 5 connected to the same testing apparatus 1 should be of the same type, and may be of the same or different type as those of the other one(s) of the testing apparatuses 1.

In step S52, in response to receipt of the test request from each testing apparatus 1, the cloud server unit 3 sends to each testing apparatus 1 a respective test response including at least one of the test programs that is stored in the database 31 and that corresponds to the at least one of the test items included in the test request from the testing apparatus 1. In addition, the cloud server unit 3 is operable to determine, based on the at least one of the test items included in the test request, whether the test response is to further include the test OS stored in the database 31. For example, if the at least one of the test items is associated with the physical characteristics or performance of memory ICs 52 of the IC devices 5, the test OS is not included in the respective test response. On the other hand, if the at least one of the test items is associated with computerized system validation for memory modules or SSDs, the test OS is included in the respective test response.

In step S53, upon receipt of the respective test response from the cloud server unit 3, the computerized test platform 11 of each testing apparatus 1 executes the at least one of the test programs with/without execution of the test OS so as to produce test data that corresponds to the device codes of the IC devices 5 connected to the testing apparatus 1. For example, if the IC devices 5 connected to one of the testing apparatuses 1 are SSDs, the at least one of the test programs executed by the computerized test platform 11 of this testing apparatus 1 under the test OS may be, but is not limited to, a performance test and a burn-in test of the SSDs. If the IC devices 5 connected to one of the testing apparatuses 1 are memory modules, the at least one of the test programs executed by the computerized test platform 11 of this testing apparatus 1 under the test OS may be associated with, but is not limited to, operating characteristics, high-temperature load characteristics, and different charging periods and voltages of the memory modules. It should be noted that the computerized test platform 11 is operable to output an input signal to the heater controller 16 during test for high-temperature load characteristics such that the heater controller 16 controls the heater 17 based on the input signal from the computerized test platform 11 and the temperature in the test chamber 100 as sensed by the temperature sensor 18 to maintain the temperature in the test chamber 100 at the desired temperature level that conforms with the test.

In step S54, upon establishing a communication link with the master server 2 over the LAN, the computerized test platform 11 of each testing apparatus 1 transmits the test data to the master server 2. Therefore, the master server 2 acquires the test data from each testing apparatus 1.

In step S55, in response to receipt of the test data from each testing apparatus 1, the master server 2 analyzes the test data produced by the computerized test platform 11 of the testing apparatus 1 to obtain a respective test result associated with failure to pass/passing (the at least one test item) of each IC device 5 connected to the testing apparatus 1, and transmits the respective test result to the testing apparatus 1. Therefore, for each testing apparatus 1, upon receipt of the respective test result from the master server 2, the indicator controller 14 is operable to enable the indicator 15 to indicate the respective test result. For example, failure to pass/passing of each IC device 5 is indicated by on/off of a corresponding LED of the indicator 15. It is noted that, when the IC devices 5 connected to one testing apparatus 1 are the IC assemblies shown in FIG. 2 while one of the IC devices 5 is analyzed to have failed the test, the master server 2 further identifies, based on the test data from said one testing apparatus 1, failed one(s) of the memory ICs 52 of the failed IC device 5. In this case, the test result is associated further with passing/failure to pass of the memory ICs 52 of each IC device 5. Therefore, after testing, failed memory IC(s) 52 is/are thus sorted from good memory ICs 52.

In step S56, the master server 2 generates, based on the test data from all the testing apparatuses 1 and the test results corresponding respectively to the testing apparatuses 1, a test report that is associated with the device codes of the IC devices 5 connected to all the testing apparatuses 1 and the test platform codes of the computerized test platforms 11 of all the testing apparatuses 1, and sends the test report to the cloud server unit 3 via the Internet.

The following are some of the advantages attributed to the system and method of the present invention:

1. In such a configuration, construction of the test environment for the testing apparatuses 1 is facilitated by using the cloud server unit 3, and the cloud server unit 3 is also able to remotely monitor the qualifications (e.g., passing or not passing certain test(s)) of the IC devices 5 connected to the testing apparatuses 1 using the test report sent from the master server 2.

2. By automatically executing the test program(s) on the computerized test platform 11 of each testing apparatus 1, test efficiency for each testing apparatus 1 can be enhanced without unintentional human operating mistakes, and test time for each testing apparatus 1 can be reduced.

3. Each testing apparatus 1 with such computerized test platform 11 of this invention has a relatively simple configuration and a compact size and is not more than ten thousands U.S. dollars in costs. Therefore, high test throughput can be easily achieved by increasing the number of the testing apparatuses 1 connected to the cloud server unit 3 over the Internet.

4. Since failed memory ICs 52 can be effectively sorted from good memory ICs 52, IC assemblies can be assembled with sorted good memory ICs 52 to serve as the IC devices 5 for subsequent system validation testing.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A system for cloud testing and remote monitoring of a plurality of integrated circuit (IC) devices, each of the IC devices having a unique device code, the system comprising:
   a testing apparatus including
      a computerized test platform that has a unique test platform code and that is provided with a multi-interface connector unit, which is used to connect with the IC devices, and
      a network interface unit; and
   a cloud server unit connected to a communication network, said cloud server unit including a database for storing a plurality of test programs that correspond respectively to a plurality of different test items;
   wherein, when said testing apparatus establishes, using said network interface unit, a communication link with said cloud server unit over the communication network, said testing apparatus is operable to send a test request to said cloud server unit via the communication link, the test request including the device codes of the IC devices connected to said computerized test platform, the test platform code of said computerized test platform, and at least one of the test items that is associated with the IC devices,
   in response to receipt of the test request from said testing apparatus, said cloud server unit is operable to send a test response to said testing apparatus via the communication link, the test response including at least one of the test programs that is stored in said database and that corresponds to said at least one of the test items, and
   upon receipt of the test response from said cloud server unit, said computerized test platform is operable to produce test data that corresponds to the device codes of the IC devices in response to execution of said at least one of the test programs.

2. The system as claimed in claim 1, further comprising a master server connected to the communication network, and communicating with said testing apparatus to acquire the test data from said testing apparatus, said master server being operable to analyze the test data produced by said computerized test platform of said testing apparatus so as to obtain a test result associated with failure to pass/passing of each of the IC devices and to generate, based on the test data and the test result, a test report that is associated with the device codes of the IC devices and the test platform code of said computerized test platform, and to send the test report to said cloud server unit for storage in said database.

3. The system as claimed in claim 2, wherein:
said testing apparatus further includes an indicator, and an indicator controller coupled between said network interface unit and said indicator for controlling said indicator; and
said master server is operable to transmit the test result to said indicator controller through said network interface unit, said indicator controller being operable to enable said indicator to indicate the test result.

4. The system as claimed in claim 3, wherein:
said network interface unit is connected wiredly to said computerized test platform; and
said network interface unit, said indicator and said indicator controller are integrated into a single module.

5. The system as claimed in claim 2, wherein said multi-interface connector unit includes a plurality of first connectors each with a first interface, and a plurality of second connectors each with a second interface different from the first interface, the IC devices being of the same type and being connected respectively with said first connectors or respectively with said second connectors.

6. The system as claimed in claim 5, each of the IC devices being a solid state disk (SSD) or a memory module, wherein said database of said cloud server unit further stores a test operating system (OS) that corresponds to said computerized test platform, and the test response sent from said cloud server unit further includes the test OS, the test data being produced in response to execution of the test OS and said at least one of the test programs.

7. The system as claimed in claim 6, wherein, when the IC devices are SSDs:
said first interface of each of said first connectors of said multi-interface connector unit conforms with a connection interface of the SSD such that said first connectors are adapted to connect respectively with the SSDs; and
said at least one of the test programs executed by said computerized test platform is associated with a performance test and a burn-in test of the SSDs.

8. The system as claimed in claim 6, wherein, when the IC devices are memory modules:
said second interface of each of said second connectors of said multi-interface connector unit conforms with a connection interface of the memory module such that said second connectors are adapted to connect respectively with the memory modules; and
said at least one of the test programs executed by said computerized test platform is associated with operating characteristics, high-temperature load characteristics, and different charging periods and voltages of the memory modules.

9. The system as claimed in claim 8, wherein said testing apparatus further includes:
a hoes ing configured with a test chamber for receiving therein said computerized test platform with the IC devices to said computerized test platform;
a heater disposed in said housing for heating said test chamber; and
a heater controller disposed in said housing and coupled to said heater and said computerized test platform for controlling said heater in response to an input signal from said computerized test platform during a test for high-temperature load characteristics to maintain the temperature in said test chamber at a desired temperature level that conforms with the test.

10. The system as claimed in claim 5, each of the IC devices including a test fixture that has the unique device code and a connection interface, and a plurality of memory ICs that are disposed detachably in the test fixture, wherein:
said second interface of each of said second connectors of said multi-interface connector unit conforms with the connection interface of the test fixture such that each of the IC devices is connected electrically to a corresponding one of said second connectors; and
when one of the IC devices is analyzed to have failed, said master server is operable to further identify, based on the test data from said testing apparatus, failed one(s) of the memory ICs of the failed one of the IC devices such that the test result is associated further with passing/failure to pass of the memory ICs of each of the IC devices.

11. A method for cloud testing and remote monitoring of a plurality of integrated circuit (IC) devices using a system that includes a testing apparatus and a cloud server unit connected to a communication network, the testing apparatus including a computerized test platform that has a unique test platform code and that is connected to the IC devices, each of the IC devices having a unique device code, the cloud server unit storing a plurality of test programs that correspond respectively to a plurality of different test items, said method comprising the steps of:
a) upon establishing a communication link with the cloud server unit in the communication network, the computerized test platform of the testing apparatus sending a test request to the cloud server unit via the communication link, the test request includes the device codes of the IC devices, the test platform code of the computerized test platform, and at least one of the test items that is associated with the IC devices;
b) in response to receipt of the test request from the computerized test platform, the cloud server unit sending a test response to the computerized test platform via the communication network, the test response including at least one of the test programs that corresponds to the at least one of the test items; and
c) the computerized test platform executing the at least one of the test programs to produce test data that corresponds to the device codes of the ID devices.

12. The method as claimed in claim 11, the system further including a master server that is connected to the communication network, and that communicates with the testing apparatus, said method further comprising the steps of:
d) the computerized test platform of the testing apparatus transmitting the test data to the master server; and
e) upon receipt of the test data from the testing apparatus, the master server analyzing the test data to obtain a test result associated with failure to pass/passing of each of the IC devices, generating, based on the test data and the test result, a test report that is associated with the device codes of the IC devices and the test platform code of the computerized test platform, and sending the test report to the cloud server unit via the communication network.

13. The method as claimed in claim 12, the testing apparatus further including an indicator, wherein, in step e) the master server further transmits the test result to the testing apparatus, the method further comprising the step of f) upon receipt of the test result from the master server, the testing apparatus indicating the test result using the indicator.

14. The method as claimed in claim 12, the cloud server unit further storing a test operating system (OS) that corresponds to the computerized test platform, each of the IC devices being a solid state disk (SSD) or a memory module, wherein:

in step b), the test response sent from the cloud server unit further includes the test OS; and in step c), the computerized test platform further executes the test OS, and the test data is produced in response to the execution of the test OS and the at least one of the test programs.

15. The method as claimed in claim 14, the IC devices being SSDs, wherein the at least one of the test programs included in the test response in step b) is associated with a performance test and a burn-in test of the SSDs.

16. The method as claimed in claim 14, the IC devices being memory modules, wherein the at least one of the test programs included in the test response in step b) is associated with operating characteristics, high-temperature load characteristics, and different charging periods and voltages of the memory modules.

17. The method as claimed in claim 12, each of the IC devices including a test fixture that has the unique device code, and a plurality of memory ICs that are disposed detachably in the test fixture, wherein, in step e):

when one of the IC devices is analyzed to have failed the test, the master server further identifies, based on the test data from the testing apparatus, failed one (s) of the memory ICs of the failed one of the IC devices such that the test result is associated further with the failed one(s) of the memory ICs of the failed one of the IC devices.

* * * * *